United States Patent
Sugimae et al.

(10) Patent No.: US 8,369,144 B2
(45) Date of Patent: Feb. 5, 2013

(54) SEMICONDUCTOR DEVICE AND METHOD OF MANUFACTURING THE SAME

(75) Inventors: Kikuko Sugimae, Yokohama (JP); Hiroyuki Kutsukake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,398

(22) Filed: Sep. 18, 2011

(65) Prior Publication Data

US 2012/0243358 A1 Sep. 27, 2012

(30) Foreign Application Priority Data

Mar. 22, 2011 (JP) ................. 2011-063350

(51) Int. Cl.
*G11C 11/34* (2006.01)
*G11C 16/04* (2006.01)
*G11C 5/02* (2006.01)
*G11C 5/06* (2006.01)
*H01L 21/336* (2006.01)

(52) U.S. Cl. ....... 365/185.07; 365/51; 365/63; 257/368; 257/E27.01; 438/294

(58) Field of Classification Search ............ 365/185.17, 365/51, 63; 257/368, E27.01; 438/294
See application file for complete search history.

(56) References Cited

U.S. PATENT DOCUMENTS

| 7,119,413 | B2 | 10/2006 | Kutsukake et al. |
| 7,528,046 | B2 * | 5/2009 | Ichige et al. ................. 438/296 |
| 7,939,908 | B2 | 5/2011 | Kutsukake et al. |
| 2011/0193152 | A1 | 8/2011 | Kutsukake et al. |
| 2012/0032243 | A1 * | 2/2012 | Kutsukake et al. ........... 257/298 |

FOREIGN PATENT DOCUMENTS

JP 2006-59978 3/2006

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a semiconductor device includes a semiconductor substrate including a device region which is isolated by a device isolation film, a first conductive layer provided on the device region via a gate insulation film, an inter-gate insulation film provided on the first conductive layer and including an opening on the first conductive layer, a second conductive layer disposed over the device region and the device isolation film via the inter-gate insulation film, a third conductive layer provided on the first conductive layer, isolated from the second conductive layer by a peripheral trench, and connected to the first conductive layer via the opening of the inter-gate insulation film, and source/drain diffusion layers provided, spaced apart, in the device region in a manner to sandwich the first conductive layer.

17 Claims, 14 Drawing Sheets

Cross-sectional structure (First embodiment)

← Channel length direction

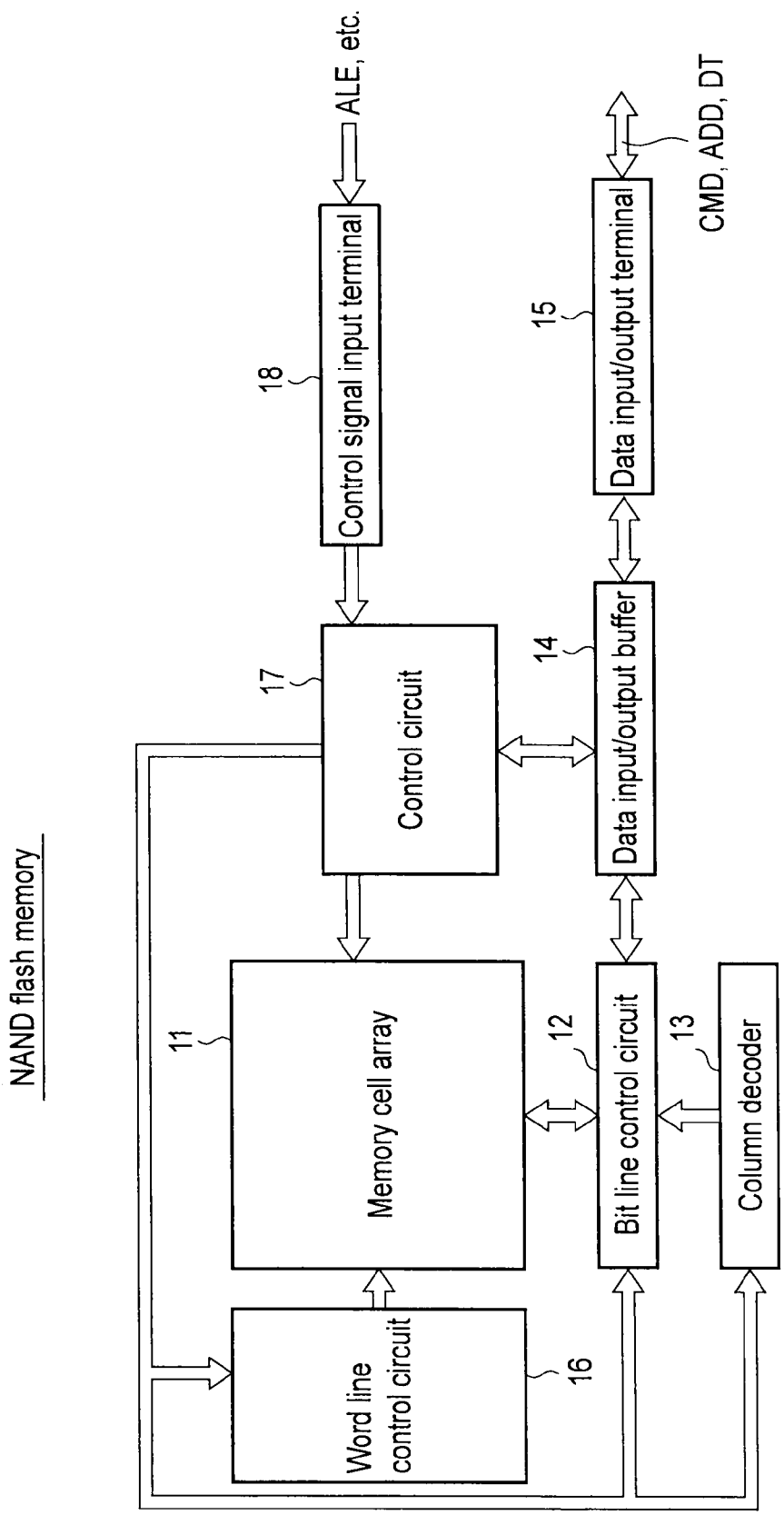
F I G. 1

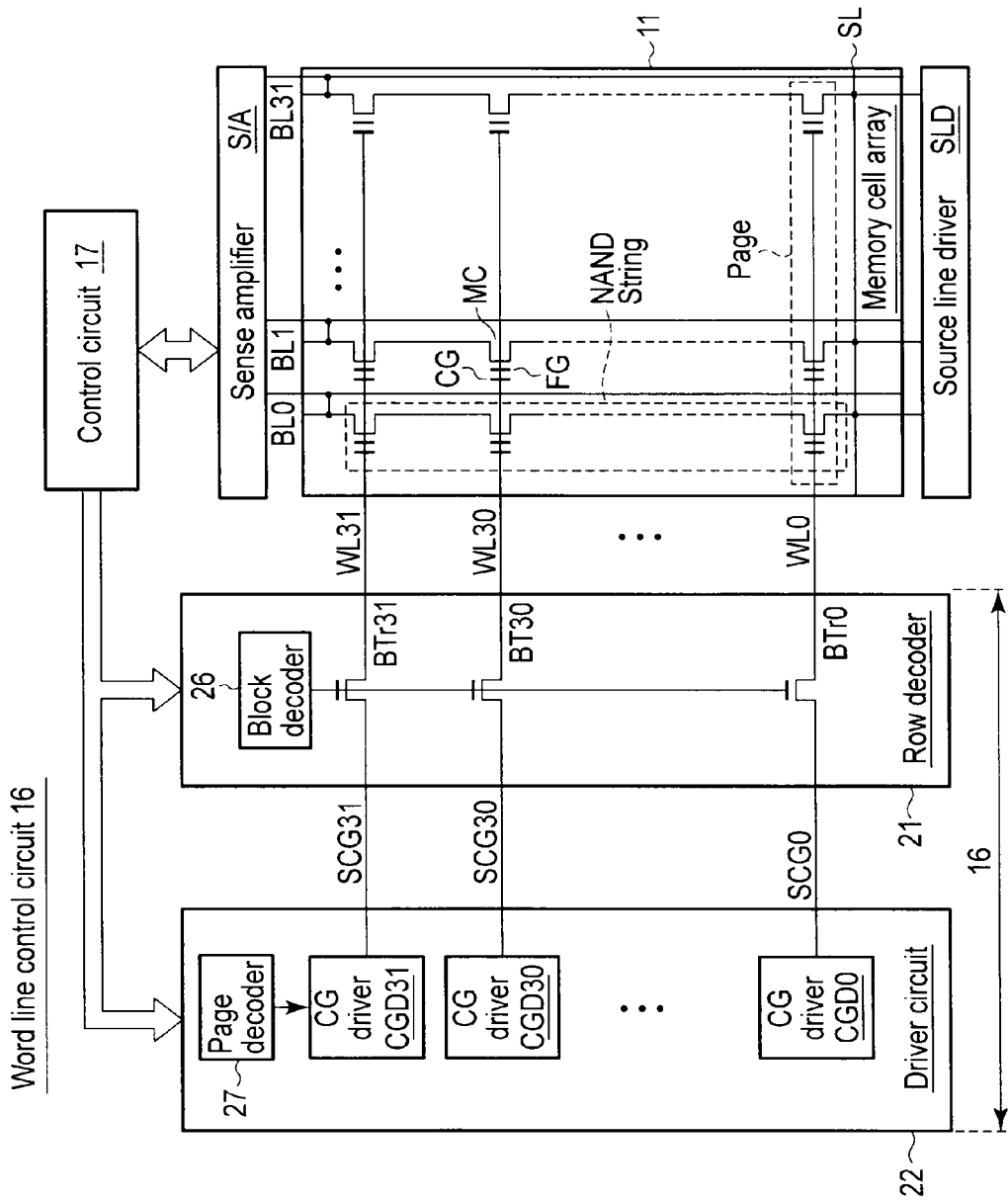
F I G. 2

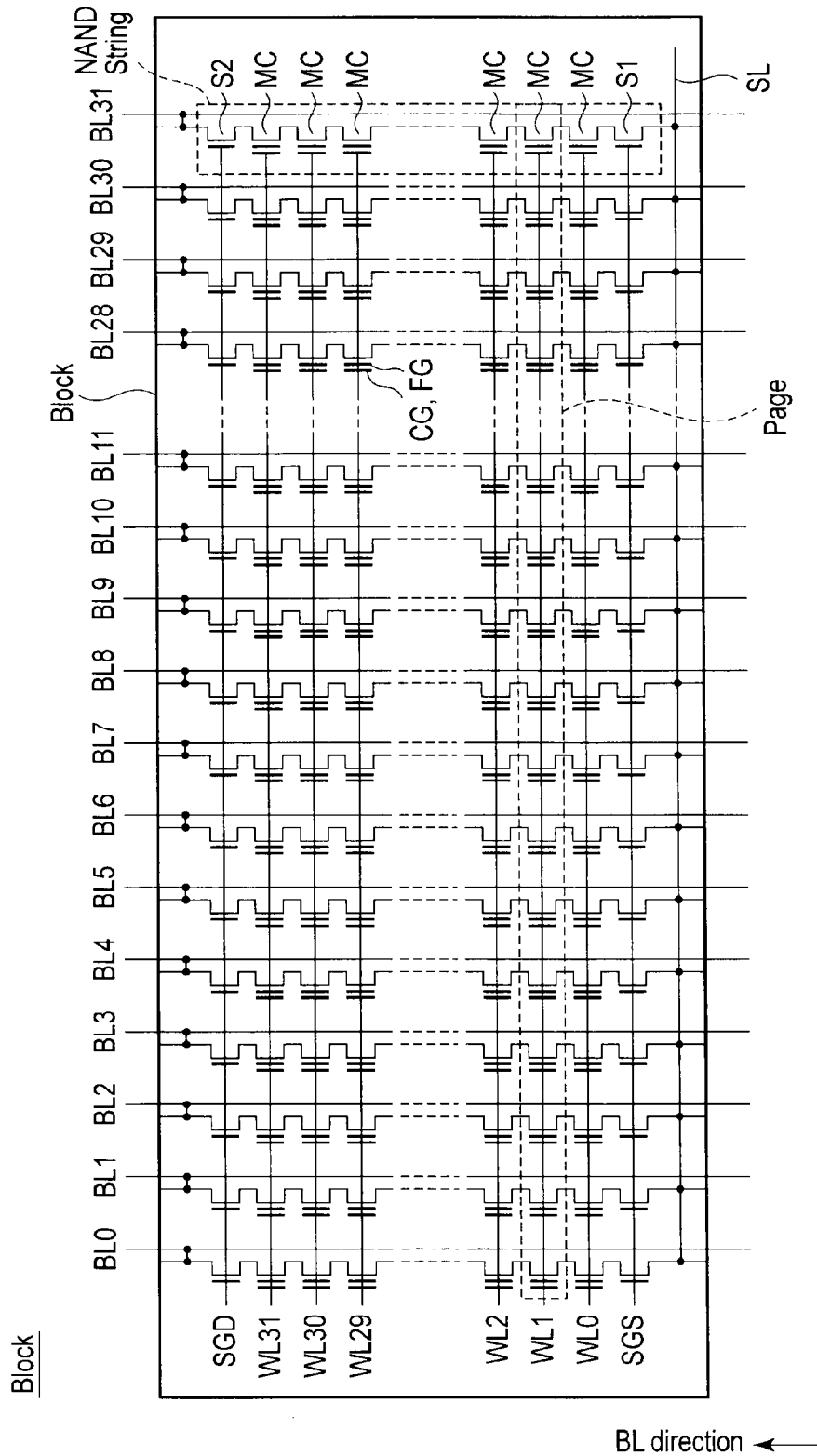
F I G. 3

Cross-sectional structure (First embodiment)

Cross-sectional structure (First embodiment)

At time of non-selection of block

At time of non-selection of block

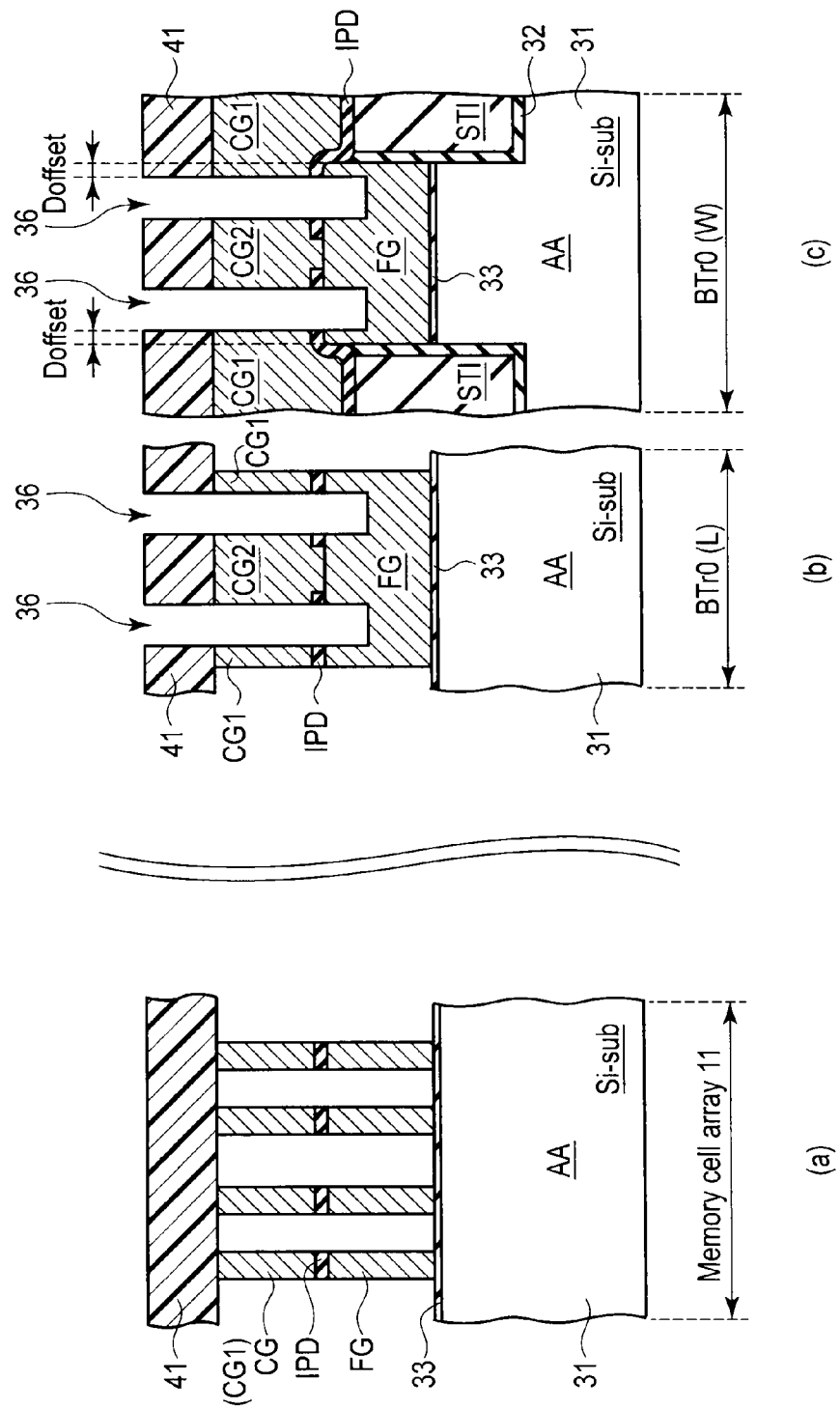
F I G. 12

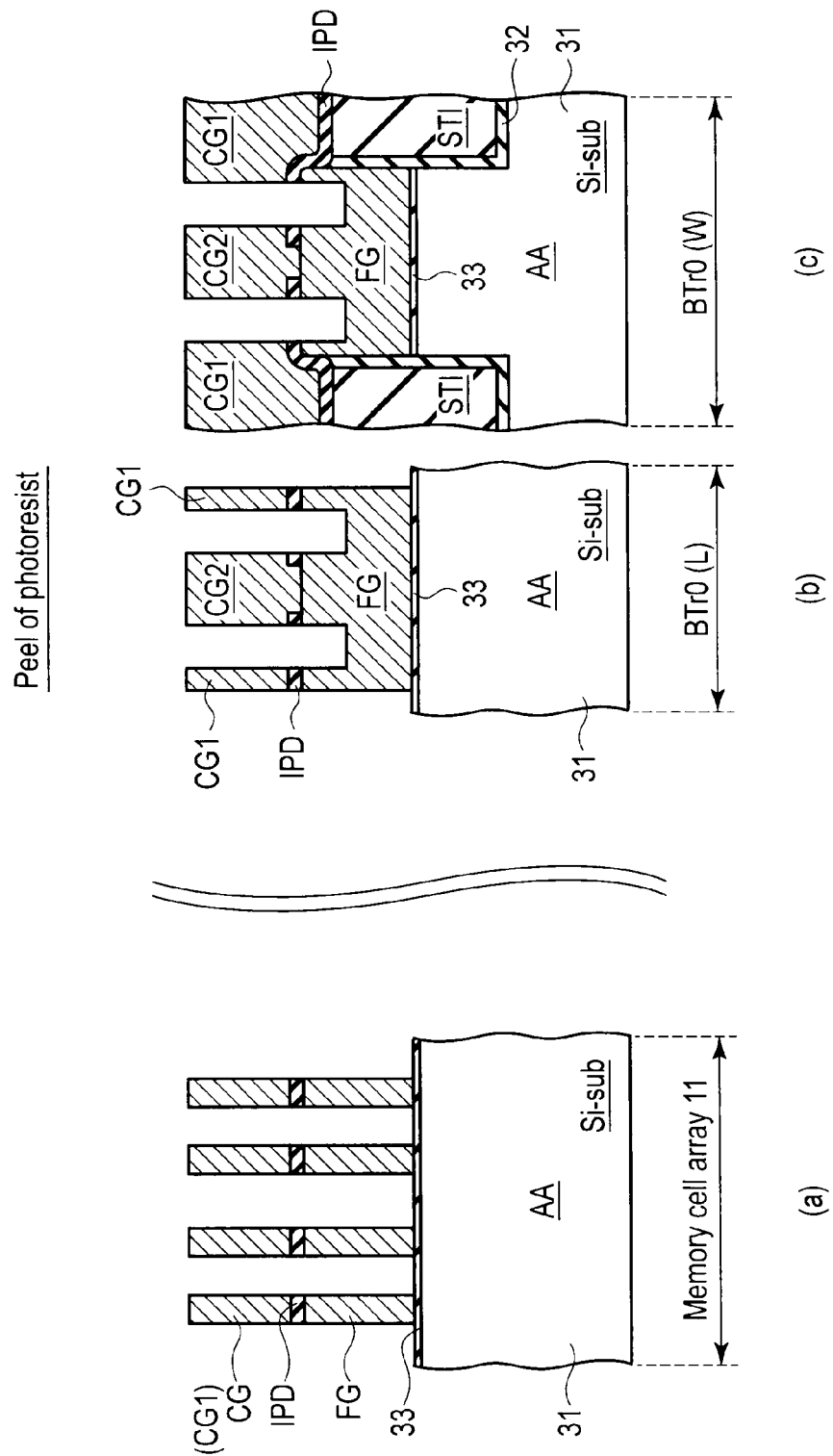
F I G. 13

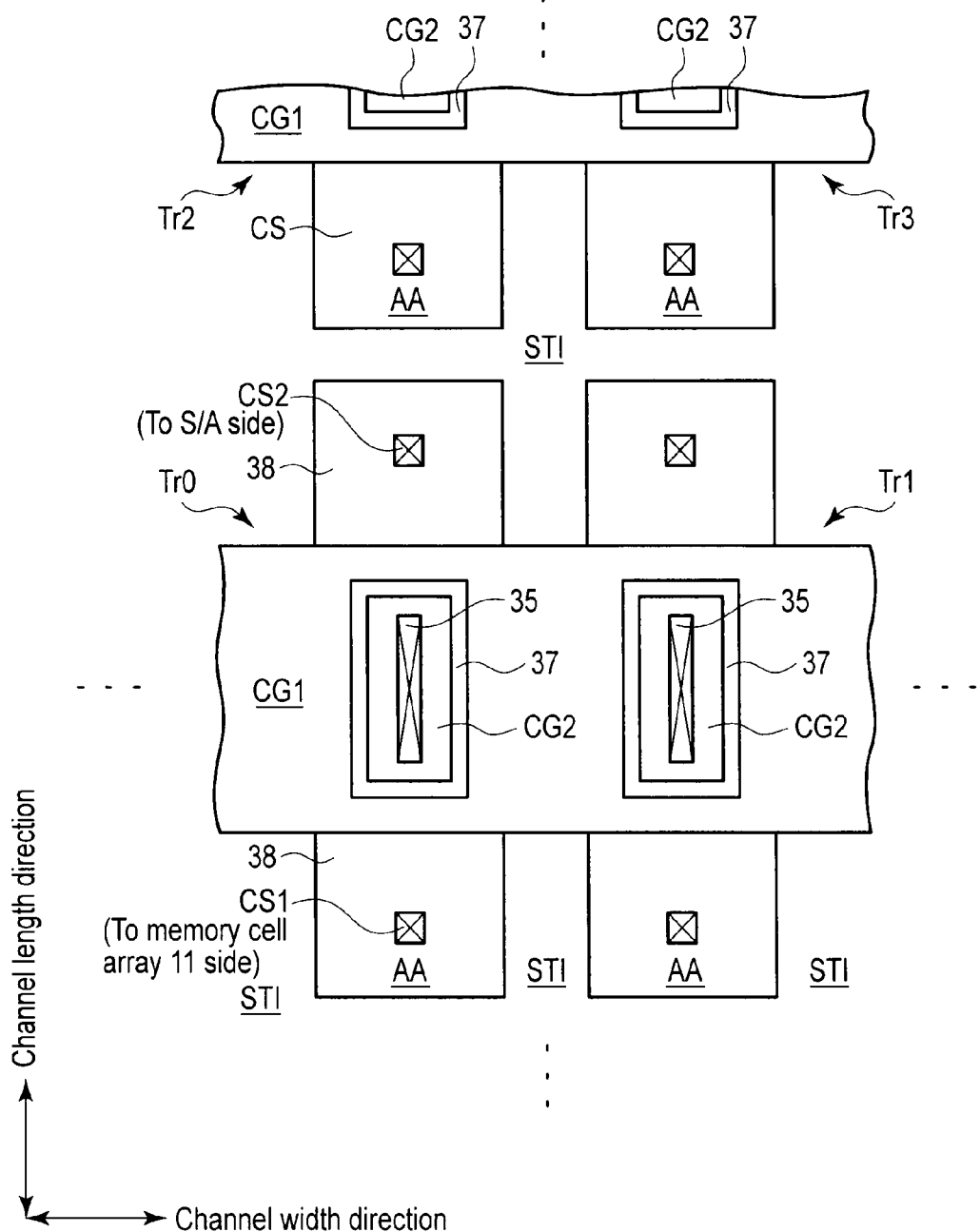
F I G. 15

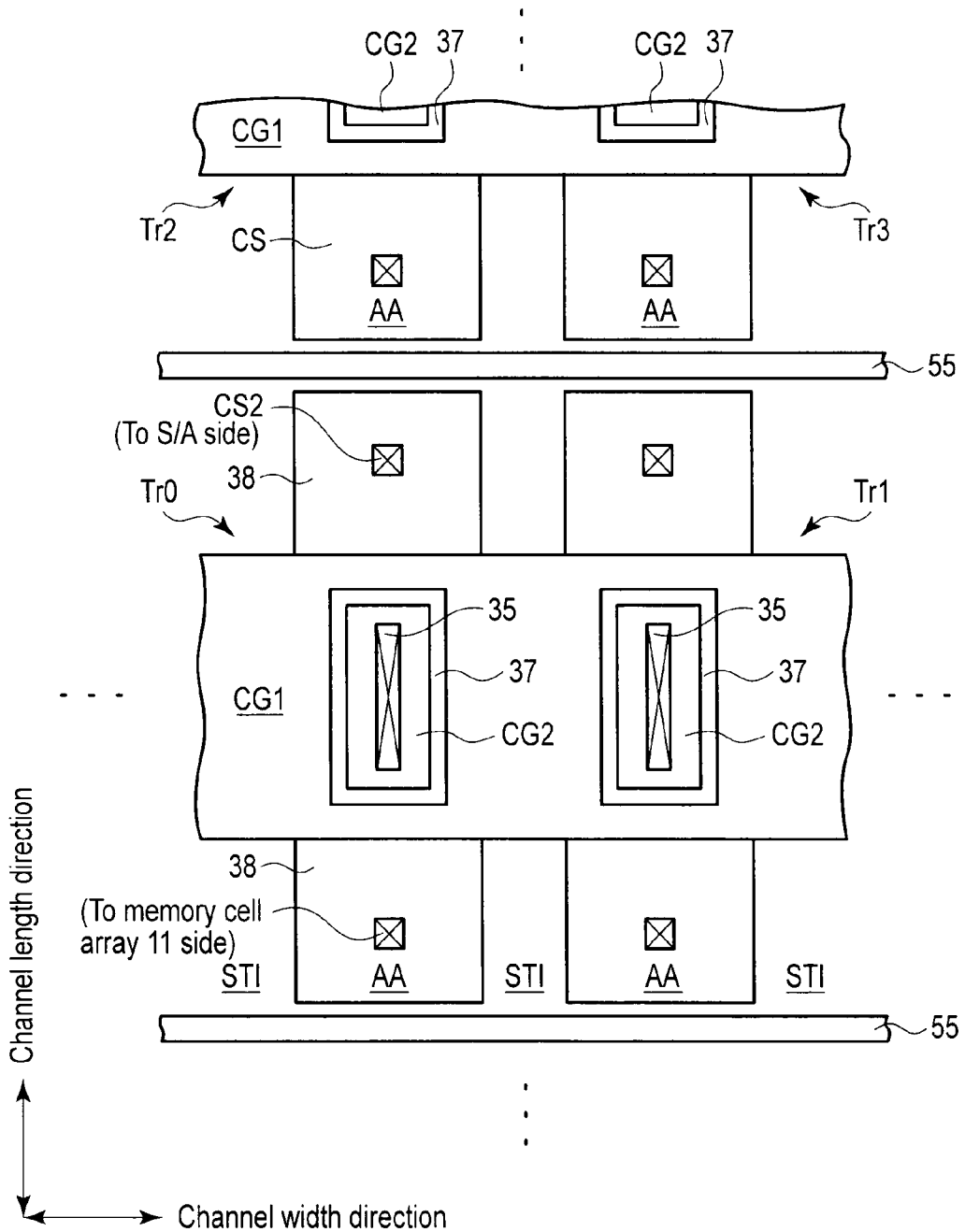
F I G. 16

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2011-063350, filed Mar. 22, 2011, the entire contents of which are incorporated herein by reference.

FIELD

Embodiments described herein relate generally to a semiconductor device and a method of manufacturing the same.

BACKGROUND

In a NAND flash memory, a gate of a memory cell, which is disposed in a memory cell array, comprises, for example, a floating gate and a control gate, and the floating gate and the control gate are electrically isolated by an inter-gate insulation film. On the other hand, a gate of a transfer transistor, which is disposed in a peripheral circuit of the memory cell array and configured to transfer a select voltage/non-select voltage to the memory cell, comprises, for example, a floating gate and a control gate which are stacked, but a part of the above-described inter-gate insulation film is removed and the floating gate and the control gate are connected.

BRIEF DESCRIPTION OF THE DRAWINGS

FIG. 1 is a block diagram showing an entire structure example of a semiconductor device according to a first embodiment;

FIG. 2 is an equivalent circuit diagram showing a structure of a peripheral circuit of a memory cell array of the semiconductor device according to the first embodiment;

FIG. 3 is an equivalent circuit diagram showing a block (Block) which constitutes a memory cell array in FIG. 1;

FIG. 12 is a cross-sectional view illustrating a fabrication step of the semiconductor device according to the first embodiment;

FIG. 13 is a cross-sectional view illustrating a fabrication step of the semiconductor device according to the first embodiment;

FIG. 15 is a plan view showing a plan-view structure of a transfer transistor according to a second embodiment; and FIG. 16 is a plan view showing a plan-view structure of a transfer transistor according to a third embodiment.

DETAILED DESCRIPTION

Figure 4:
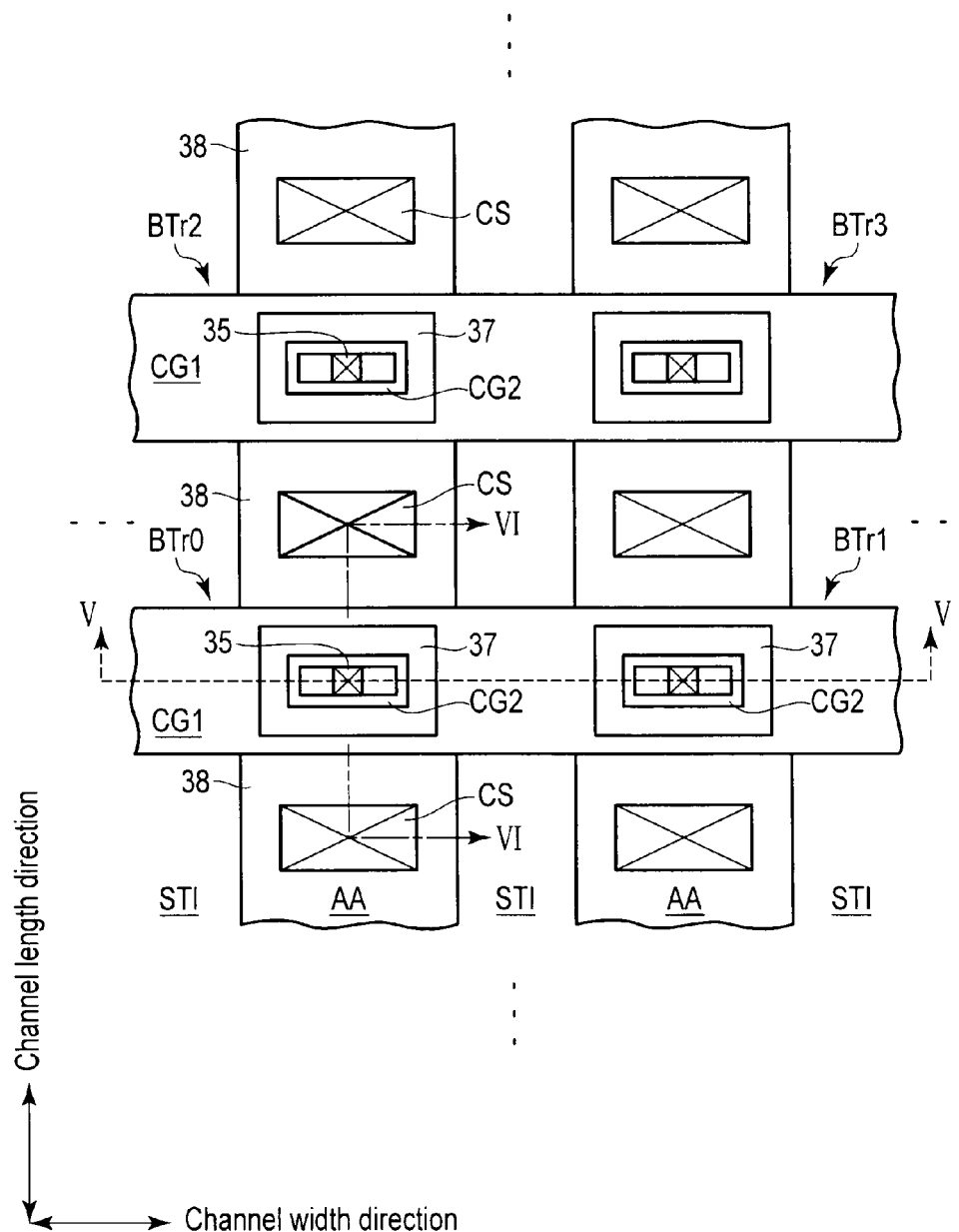
FIG. 4 is a plan view showing a plan-view structure of a transfer transistor in FIG. 2.

In general, according to one embodiment, a semiconductor device includes a semiconductor substrate including a device region which is isolated by a device isolation film; a first conductive layer provided on the device region via a gate insulation film; an inter-gate insulation film provided on the first conductive layer and including an opening on the first conductive layer; a second conductive layer disposed over the device region and the device isolation film via the inter-gate insulation film; a third conductive layer provided on the first conductive layer, isolated from the second conductive layer by a peripheral trench, and connected to the first conductive layer via the opening of the inter-gate insulation film; and source/drain diffusion layers provided, spaced apart, in the device region in a manner to sandwich the first conductive layer.

In the above-described structure of a transfer transistor, a control gate of the transfer transistor, which is disposed in a peripheral circuit, is provided so as to also extend over the device isolation film (trench isolation film). Consequently, due to a potential (select voltage/non-select voltage) that is applied to the control gate, a leak current may occur between the transfer transistor and the device isolation film.

Embodiments will now be described with reference to the accompanying drawings. In the description below, a NAND flash memory is described by way of example, but the embodiments are not limited to the NAND flash memory. In the description, common parts are denoted by like reference numerals throughout the drawings.

First Embodiment

1. Structure Example 1-1. Entire Structure

To begin with, referring to FIG. 1, an entire structure of a semiconductor device according to a first embodiment is described. A NAND flash memory is described by way of example.

As shown in FIG. 1, the NAND flash memory according to the first embodiment includes a memory cell array 11, a bit line control circuit 12, a column decoder 13, a data input/output buffer 14, a data input/output terminal 15, a word line control circuit 16, a control circuit 17, and a control signal input terminal 18.

The memory cell array 11 is composed of a plurality of blocks (Block) each including a plurality of memory cells which are arranged in a matrix at intersections between bit lines and word lines. The word line control circuit 16 which controls the word lines, the bit line control circuit 12 which controls the bit lines and the control circuit 17 are electrically connected to the memory cell array 11. A structure example of the block (Block) will be described later.

The bit line control circuit 12 reads out data of memory cells in the memory cell array 11 via the bit lines, and detects the states of the memory cells in the memory cell array 11 via the bit lines ("verify read"). The bit line control circuit 12 applies a write control voltage to the memory cells in the memory cell array 11 via the bit lines, thereby executing data write in the memory cells. The column decoder 13, data input/output buffer 14 and control circuit 17 are electrically connected to the bit line control circuit 12.

A data memory circuit (not shown) is provided in the bit line control circuit 12, and the data memory circuit is selected by the column decoder 13. The data of the memory cell, which is read out to the data memory circuit, is output to the outside from the data input/output terminal 15 via the data input/output buffer 14.

The data input/output terminal 15 is connected to, for example, a host apparatus which is provided outside the NAND flash memory. The host apparatus is, for example, a microcomputer, and receives data which is output from the data input/output terminal 15. Further, the host apparatus outputs various commands CMD, addresses ADD and data DT, which control the operation of the NAND flash memory.

The write data DT, which is input from the host apparatus to the data input/output terminal 15, is supplied via the data input/output buffer 14 to the data memory circuit which is selected by the column decoder 13. On the other hand, the command CMD and the address ADD are supplied to the control circuit 17.

The word line control circuit 16 selects a word line in the memory cell array 11, and applies to the selected word line a voltage necessary for data read, data write or data erase, which is supplied from a power supply voltage generating circuit (not shown).

The control circuit 17 controls the entire operation of the NAND flash memory. The control circuit 17 is electrically connected to the memory cell array 11, bit line control circuit 12, column decoder 13, data input/output buffer 14, and word line control circuit 16. These structural circuits are controlled by the control circuit 17.

The control signal input terminal 18 is electrically connected to the control circuit 17. The control circuit 17 is controlled by a control signal, such as an ALE (address latch enable) signal, which is input from the external host apparatus via the control signal input terminal 18.

The word line control circuit 16, bit line control circuit 12, column decoder 13, and control circuit 17 constitute a data write circuit, a data read circuit and a data erase circuit.

1-2. Structure Example of Word Line Control Circuit

Next, referring to FIG. 2, a structure example of the word line control circuit 16 is described. In this case, a part of the peripheral structure of the memory cell array 11 in FIG. 1 is described.

As shown in FIG. 2, the word line control circuit 16 according to this example includes a row decoder 21 and a driver circuit 22 which are electrically connected to the memory cell array 11.

The memory cell array 11 includes a plurality of memory cells MC which are disposed at intersections between a plurality of bit lines (BL0 to BL31) and a plurality of word lines (WL0 to WL31). Each of the memory cells MC includes a floating gate FG and a control gate CG which are successively stacked on a semiconductor substrate. The floating gate FG and the control gate CG are electrically insulated by an intergate insulation film (not shown).

Current paths of the memory cells MC are connected in series, thereby constituting a NAND string (NAND String). A plurality of memory cells MC in a word line direction constitute a page (Page). In the NAND flash memory according to this example, data read and data write are executed in units of the page (Page). Data erase is executed batchwise in units of a block (Block) which will be described later.

One end of a current path of the NAND string is connected to a source line SL, and the other end of the current path of the NAND string is connected to a sense amplifier S/A. A predetermined voltage is applied to the source line SL from a source line driver SLD. The sense amplifier S/A senses a potential of the bit line (BL0 to BL31), and reads out data of the memory cell MC. The source line driver SLD and sense amplifier S/A are disposed in the bit line control circuit 12 in FIG. 1.

The row decoder 21 includes a block decoder 26 and transfer transistor BTr0 to BTr31). The block decoder 26 decodes a block address which is input from the control circuit 17.

One end of the current path of the transfer transistor (BTr0 to BTr31) is supplied with a control signal (SCG0 to SCG31) from the driver circuit 22, and the other end of the current path is connected to the word line (WL0 to WL31). In accordance with an output from the block decoder 21, which is supplied to the gate of the transfer transistor (BTr0 to BTr31), the transfer transistor (BTr0 to BTr31) transfers a predetermined select voltage/non-select voltage to the word line (WL0 to WL31) and applies the predetermined select voltage/non-select voltage to the control gate CG, at a time of data write, data read or data erase. The details of the transfer transistor (BTr0 to BTr31) will be described later.

The driver circuit 22 includes a page decoder 27 and CG drivers (CGD0 to CGD31). The page decoder 27 decodes a page address which is input from the control circuit 17. In accordance with an output from the page decoder 27, the CG drivers (CGD0 to CGD31) output control signals (SCG0 to SCG31) to the row decoder 21.

1-3. Structure Example of the Block (Block)

Next, referring to FIG. 3, a structure example of the block is described. One block (Block) in the memory cell array 11 is described by way of example. In the case of this example, the memory cells in the block (Block) are erased batchwise. In short, the block is a data erase unit.

The block (Block) comprises a plurality of NAND strings (NAND String) which are arranged in a WL (word line) direction. The NAND string (NAND String) comprises 32 memory cells MC, which have current paths connected in series, and select transistors S1 and S2 which are connected to one end and the other end of the current path of the NAND string. In this example, the NAND string comprises 32 memory cells MC. However, the number of memory cells MC is not limited to 32, and may be two or more, for example, 8, 16 or 64.

One end of the current path of the select transistor S1 is connected to the source line SL, and one end of the current path of the select transistor S2 is connected to the bit line, BL0 to BL31.

The word line WL extends in the WL direction, and is connected commonly to the control gates CG of the plural memory cells MC in the WL direction. A select gate line SGS extends in the WL direction, and is connected commonly to the gates of the plural select transistors S1 in the WL direction. Similarly, a select gate line SGD extends in the WL direction, and is connected commonly to the gates of the plural select transistors S2 in the WL direction.

1-4. Structure Example of the Transfer Transistor

Figure 5:
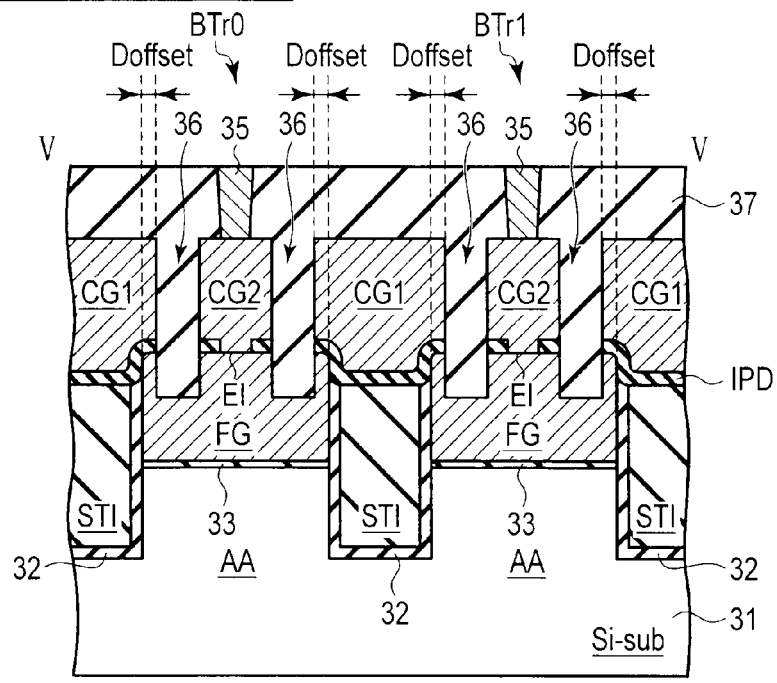
FIG. 5 is a cross-sectional view taken along line V-V in FIG. 4, as viewed in a direction of arrows.
Figure 6:
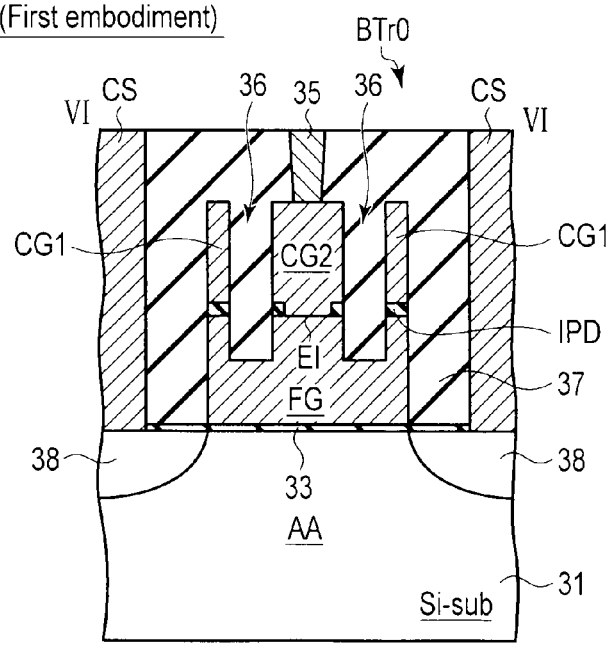
FIG. 6 is a cross-sectional view taken along line VI-VI in FIG. 4, as viewed in a direction of arrows.

Next, referring to FIG. 4 to FIG. 6, a structure example of the transfer transistor is described. In this description, transfer transistors BTr0 to BTr3 in the row decoder 21 in FIG. 2 are taken as examples.

1-4-1. Plan-View Structure

FIG. 4 is a plan view which schematically shows transfer transistors BTr0 to BTr3. As shown in FIG. 4, device regions AA (Active Area), which are isolated by a device isolation film STI (Shallow Trench Isolation), are provided on a major surface of a semiconductor substrate so as to extend in a channel length direction. The transfer transistors BTr0 to BTr3, which are high breakdown voltage transistors, are arranged on the device regions AA.

Each of the transfer transistors BTr0 to BTr3 includes control gates CG1 and CG2 (first and second control gates) which are provided on a gate insulation film, source/drain diffusion layers 38, contact wirings 35 and CS, and an interlayer insulation film 37.

The first control gate (second conductive layer) CG1 is disposed in a channel width direction over the device regions AA and the device isolation films STI. Thus, the control gate CG1 is shared by the transfer transistors BTr0 and BTr1 in FIG. 4 which neighbor in the channel width direction. In addition, the control gate CG1 is shared by the transfer transistors BTr2 and BTr3 in FIG. 4 which neighbor in the channel width direction. The outer periphery of the control gate CG1 is provided so as to cross the device region AA and device isolation film STI. On the other hand, the control gate CG1 has an inner periphery at each of positions crossing the device regions AA.

The second control gate (third conductive layer) CG2 is disposed to be surrounded by the interlayer insulation film 37 which is formed on the inner peripheral side of the control gate CG1. Thus, the control gate CG2 is detached and electrically isolated from the control gate CG1. The control gate CG2 is electrically connected to a floating gate (first conductive layer) which is not shown.

The source/drain diffusion layers 38 are provided, spaced apart, in the semiconductor substrate of the device region AA so as to sandwich the control gates CG1 and CG2 in the channel length direction. The source/drain diffusion layers 38 function as current paths of the transfer transistors BTr0 to BTr3. One of the source/drain diffusion layers 38 is shared by the transfer transistors BTr0 and BTr2 or the transfer transistors BTr1 and BTr3 in FIG. 4 which neighbor in the channel length direction.

The contact wiring 35 is provided on the control gate (second control gate) CG2. The contact wiring CS is provided on the source/drain diffusion layer 38.

The interlayer insulation film 37 is provided in a manner to cover the transfer transistors BTr0 to BTr3.

1-4-2. Cross-Sectional Structure

FIG. 5 is a cross-sectional view taken along line V-V in FIG. 4. FIG. 6 is a cross-sectional view taken along line VI-VI in FIG. 4.

As shown in FIG. 5 and FIG. 6, the transfer transistor BTr0, BTr1 includes a floating gate FG, an inter-gate insulation film IPD and control gates CG1 and CG2, which are provided on a semiconductor substrate (Si-sub) via a gate insulation film 33. A barrier film 32 is provided on an interface of the device isolation film STI.

The floating gate FG (first conductive layer) is provided on the gate insulation film 33 in the device region AA.

The control gate (second conductive layer) CG1 is disposed in the channel width direction over the device region AA and device isolation film STI. The control gate CG1 includes an offset region Doffset which extends toward the device region AA from the barrier film 32. Thus, the control gate CG1 is provided to extend over the device region AA in a cross section in the channel width direction extending through an opening EI.

The control gate (third conductive layer) CG2, as described above, is detached and electrically isolated from the control gate CG1 by burying the interlayer insulation film 37 in a trench 36 which is formed by etching the periphery of the control gate CG2 until penetrating the inter-gate insulation film IPD. The control gate CG2 is electrically connected to the floating gate FG, which is provided under the control gate CG2, via an etching portion EI (Etching Inter poly) of the inter-gate insulation film IPD which is formed near the center of the control gate CG2. In the present embodiment, a gate potential, which is applied to the control gate CG2 that is isolated in an island shape, is controlled, and the potential of the control gate GC1 (on the outside of the trench 36) can be fixed, and therefore a leak current can be prevented. The details will be described later. In the cross section in the channel width direction extending through the opening EI, the width of the control gate CG2 is less than the width of the floating gate FG. In addition, in the cross section in the channel width direction extending through the opening EI, the cross-sectional area of the control gate CG2 is less than the cross-sectional area of the floating gate FG.

It is desirable, for example, from the standpoint of reduction in leak current, that the outer periphery of the trench 36 becomes narrower (toward the device region AA side) than the inter periphery of the barrier film 32, when it sees from top. As regards the inner periphery of the trench 36, it is desirable, from the standpoint of easier processing of the trench 36, that the trench 36 surround the etching portion EI of the inter-gate insulation film IPD. It is not always necessary that the trench 36, as in this example, penetrate the inter-gate insulation film IPD. For example, the depth of the trench 36 is sufficient if the trench 36 reaches at least a position on the inter-gate insulation film IPD (or a position in the inter-gate insulation film IPD). It should suffice if the control gate CG1 and control gate CG2 are electrically isolated by the trench 36.

The contact wiring 35 is provided on the control gate CG2 and is connected to the control gate CG2.

The gate insulation film IPD is provided between the floating gate FG and the control gate CG1, CG2, and the etching portion EI (Etching Inter poly-Si) is formed in the vicinity of the center of the gate insulation film IPD. The floating gate FG and the control gate CG2 are electrically connected by the etching portion EI.

The source/drain diffusion layers 38 are provided, spaced apart, in the semiconductor substrate 31 along the channel length direction so as to sandwich the floating gate FG and control gates CG1 and CG2.

The contact wiring CS is provided on the source/drain diffusion layer 38 and electrically connects the word line and transfer potential.

The barrier film 32 is formed, where necessary, in order to suppress diffusion of impurities in the STI.

2. Transfer Operation 2-1. At Time of Selection of Block

Figure 7:
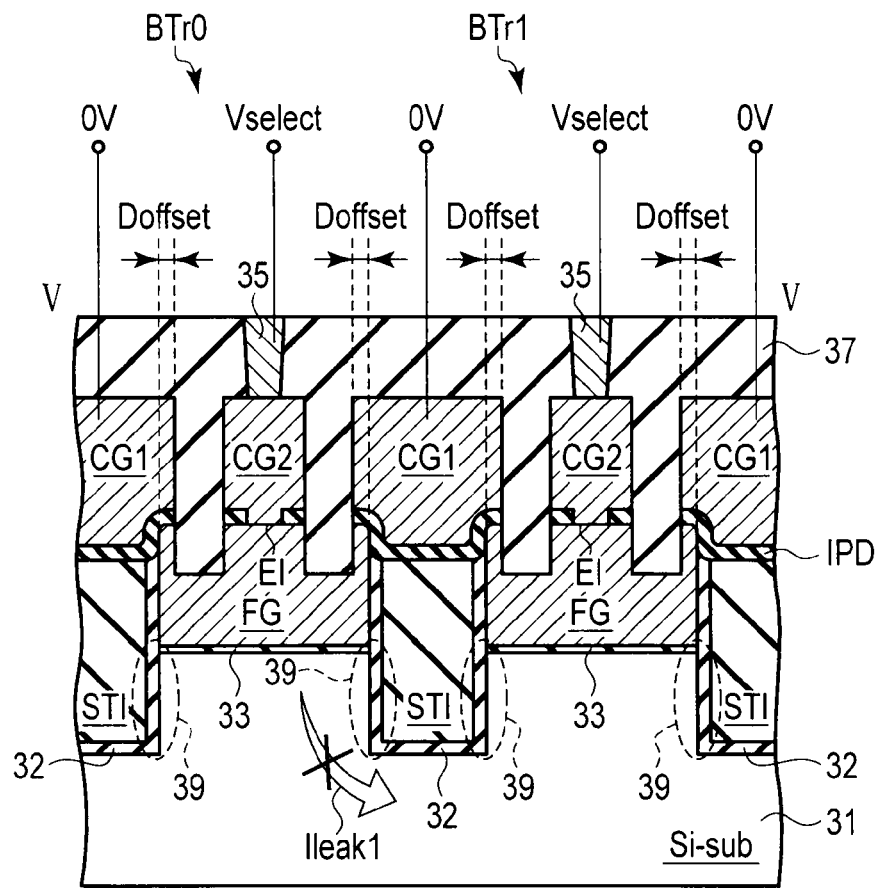
FIG. 7 is a cross-sectional view illustrating a relationship in voltage at a time when a block is selected.

Next, referring to FIG. 7, a description is given of a transfer operation at a time of selection of the block in the semiconductor device according to the first embodiment. The structure (BTr0, BTr1) shown in FIG. 5 is taken as an example.

FIG. 7 shows the relationship in voltage at a time of transferring a select voltage (Vselect) when the block (Block) is selected.

As shown in FIG. 7, a shield voltage (0 V in this example) is applied to the control gate CG1 in order to fix the potential of the control gate CG2 and to prevent the inversion of the potential of the control gate CG2. A select voltage (Vselect) is applied to the control gate CG2.

As in this relationship in voltage, since independent voltages can be applied to the control gates CG1 and CG2, it is possible to reduce a leak current Ileak1 due to field inversion which occurs beyond the device isolation film STI in the channel width direction.

In addition, the control gate CG1 in the first embodiment includes the offset region Doffset which extends toward the device region AA from the barrier film 32. Thus, the effect of the shield voltage (0 V), which is applied to the control gate CG1, can greatly be exerted also to end portions 39 of the device isolation film STI, which are indicated by broken lines in FIG. 7.

As a result, when the block is selected, the leak current Ileak1 due to the field inversion can be reduced.

2-2. At Time of Non-Selection of Block

Figure 8:
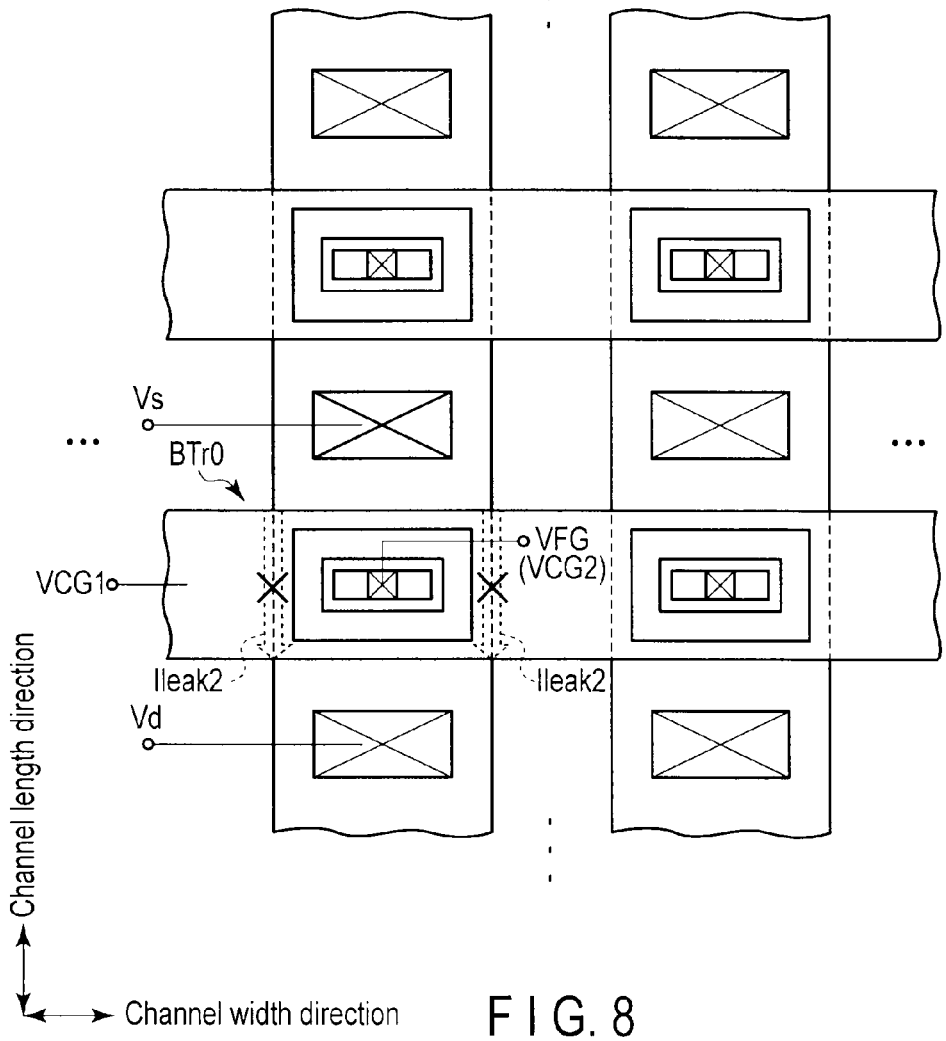
FIG. 8 is a plan view illustrating a relationship in voltage at a time when a block is not selected.
Figure 9:
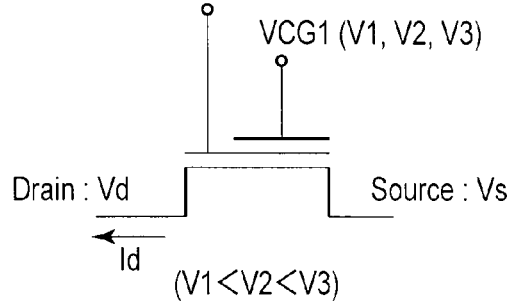
FIG. 9 is an equivalent circuit diagram illustrating a relationship in voltage at a time when a block is not selected.
Figure 10:
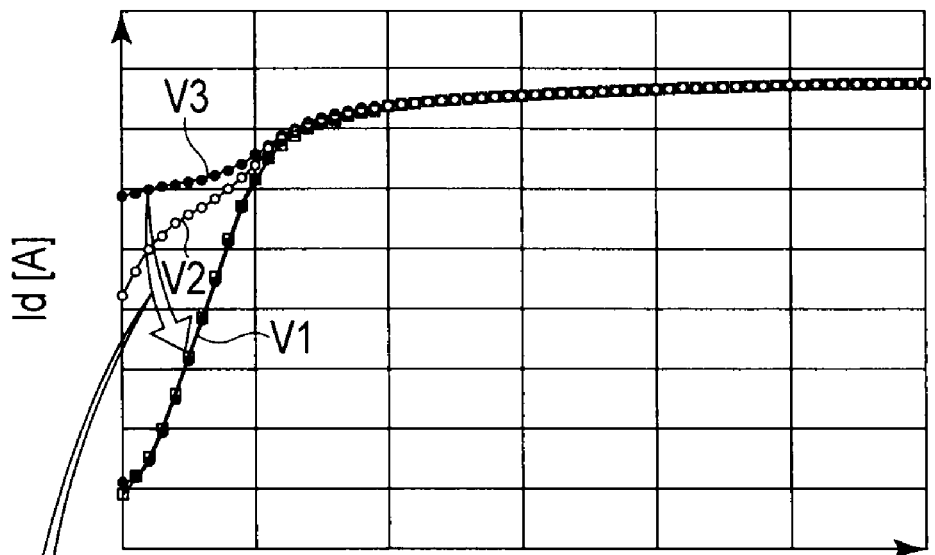
FIG. 10 is a graph showing a relationship between a voltage VCG1, which is applied to a control gate when a block is not selected, and a drain current Id.

Next, referring to FIG. 8, FIG. 9 and FIG. 10, a description is given of a transfer operation at a time of non-selection of the block in the semiconductor device according to the first embodiment. The structure (BTr0 to BTr3) shown in FIG. 4 is taken as an example.

The relationship in voltage at a time of non-selection of the block (Block) is as shown in FIG. 8. At the time of non-selection, it is possible to suppress a leak current Ileak1 which occurs due to a parasitic transistor at end portions of the device isolation films STI in the channel length direction, which are indicated by broken lines in FIG. 8.

As shown in FIG. 8, a source voltage Vs and a drain voltage Vd are applied to the contact wirings CS, and voltages VCG1 and VFG (VCG2) are applied to the control electrodes CG1 and CG2, respectively.

FIG. 9 shows an equivalent circuit illustrating this relationship in voltage.

FIG. 10 shows results which were obtained with respect to a drain current Id when the voltage that is applied to the control electrode (control gate CG1) VCG1 in FIG. 9 was varied in the order of V1, V2 and V3 (V1<V2<V3).

As shown in FIG. 10, if the voltage that is applied to the control electrode VCG1 is varied from V1 to V2 to V3 (V1<V2<V3), the drain current Id of the transfer transistor increases. In other words, it is understood that the drain voltage Id can be reduced by applying a lower voltage V1 (e.g. a ground supply voltage of about 0 V in the first embodiment).

As a result, at the time of non-selection of the block, it is possible to reduce the leak current Ileak2 which occurs due to a parasitic transistor at end portions of the device isolation films STI in the channel length direction.

3. Manufacturing Method

Next, referring to FIG. 11 to FIG. 14, a method of manufacturing the semiconductor device according to the first embodiment is described. In this description, the structure of memory cells MC in the memory cell array 11 and the transfer transistor (BTr0) is taken as an example. Part (a) in each of FIG. 11 to FIG. 14 shows memory cells MC of the NAND string in the memory cell array 11, part (b) shows the transfer transistor BTr0(L) in the channel length direction, and part (c) shows the transfer transistor BTr0(W) in the channel width direction.

Figure 11:
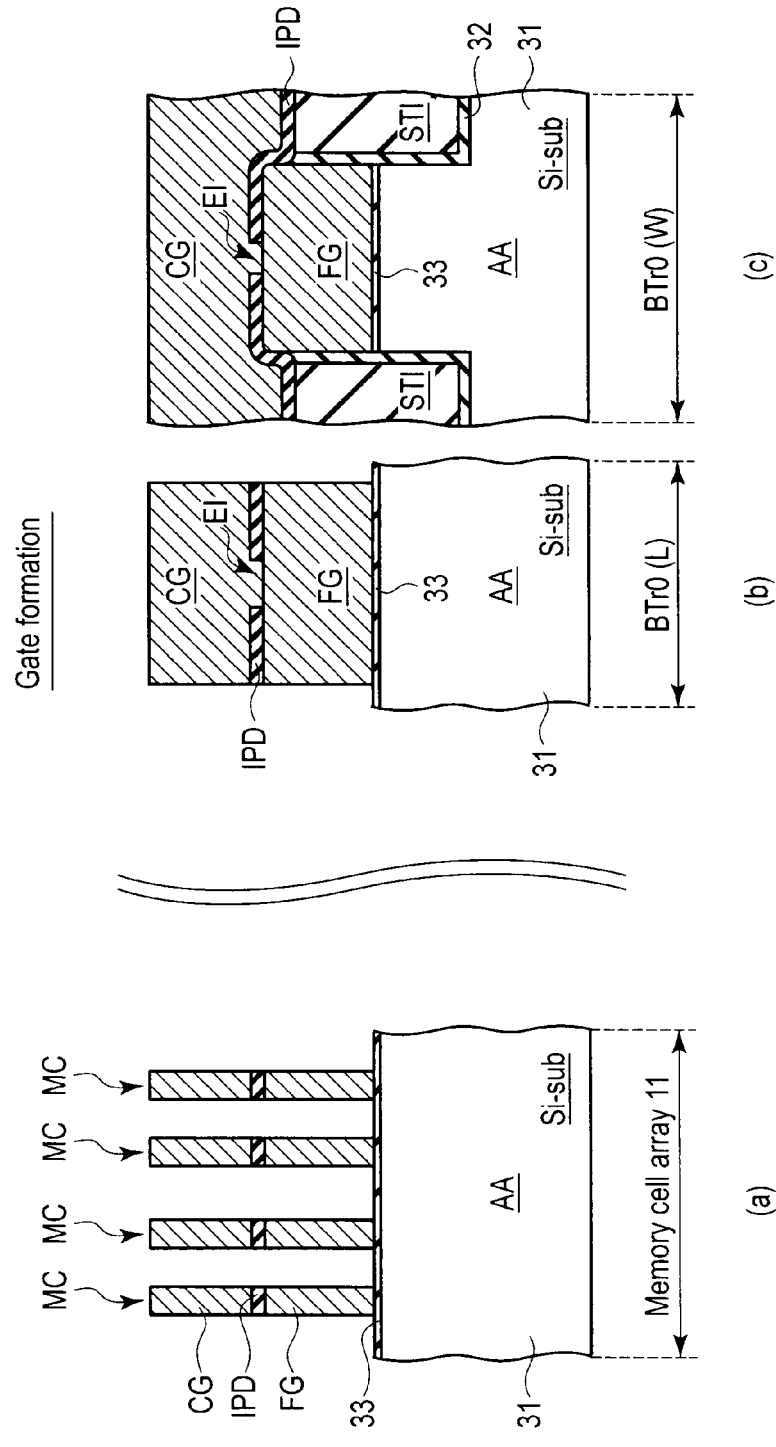
FIG. 11 is a cross-sectional view illustrating a fabrication step of the semiconductor device according to the first embodiment.

To begin with, as shown in parts (a) to (c) of FIG. 11, a silicon oxide ($SiO_2$) film is formed on a semiconductor substrate 31 by, e.g. thermal oxidation, thus forming a gate insulation film 33.

Subsequently, polysilicon (Poly-Si) or the like is deposited on the gate insulation film 33 by using, e.g. CVD (Chemical Vapor Deposition), thus forming a floating gate FG.

Then, a trench is formed in the semiconductor substrate 31 in the device isolation region by using, e.g. RIE (Reactive Ion Etching), and a barrier film (e.g. silicon oxide ($SiO_2$) 32 is formed in the trench. A silicon oxide ($SiO_2$) film, for example, is filled on the barrier film 32 in the trench, thus forming a device isolation film STI.

Subsequently, an ONO structure comprising three layers, namely, a silicon oxide ($SiO_2$) film, a silicon nitride (SiN) film and a silicon oxide ($SiO_2$) film, is formed on the floating gate FG by using, e.g. CVD, thus forming an inter-gate insulation film IPD.

Then, an etching portion EI is formed by etching, with use of, e.g. RIE, the inter-gate insulation film IPD at a central part of the gate structure of each of select transistors (S1, S2) (not shown) of the NAND string of the memory cell array 11 and a transfer transistor (BTr0), thereby exposing the floating gate FG.

Following the above, in a similar manner, polysilicon (Poly-Si) or the like is deposited by using, e.g. CVD, thus forming a control gate CG of each of memory cells MC and transfer transistor BTr0.

Thereafter, as shown in parts (a) to (c) of FIG. 12, a photoresist 41 is coated on the memory cell array 11 and transfer transistor BTr0. Then, the photoresist 41 on the transfer transistor BTr0 is exposed and developed, and a trench 36 surrounding the control gate CG2 is formed. The trench 36 is formed such that the outer periphery of the trench 36, for example, becomes narrower (toward the device region AA side) than the barrier film 32. In this case, if the trench 36 is formed such that the inner periphery of the trench 36 surrounds the etching portion EI of the inter-gate insulation film IPD, it becomes easy to perform uniform etching in the trench 36.

In addition, in this case, the conditions for exposing and developing the photoresist 41 are selected to form such an opening as to provide the above-described offset region Doffset which extends from the barrier film 32 to the device region AA.

Then, using the patterned photoresist 41 as a mask, etching is formed by, e.g. RIE, so as to penetrate the inter-gate insulation film IPD and reach the depth of the floating gate FG, thereby forming the trench 36. In this etching step, it is not imperative to penetrate the inter-gate insulation film IPD. For example, the depth of the trench 36, which is formed in the etching step, is sufficient if the trench 36 reaches at least a position on the inter-gate insulation film IPD (or a position in the inter-gate insulation film IPD). It should suffice if the control gate CG2 and control gate CG1 are electrically isolated by the trench 36.

Subsequently, as shown in parts (a) to (c) of FIG. 13, the photoresist, which is formed on the memory cell array 11 and transfer transistor BTr0, is peeled off.

Figure 14:
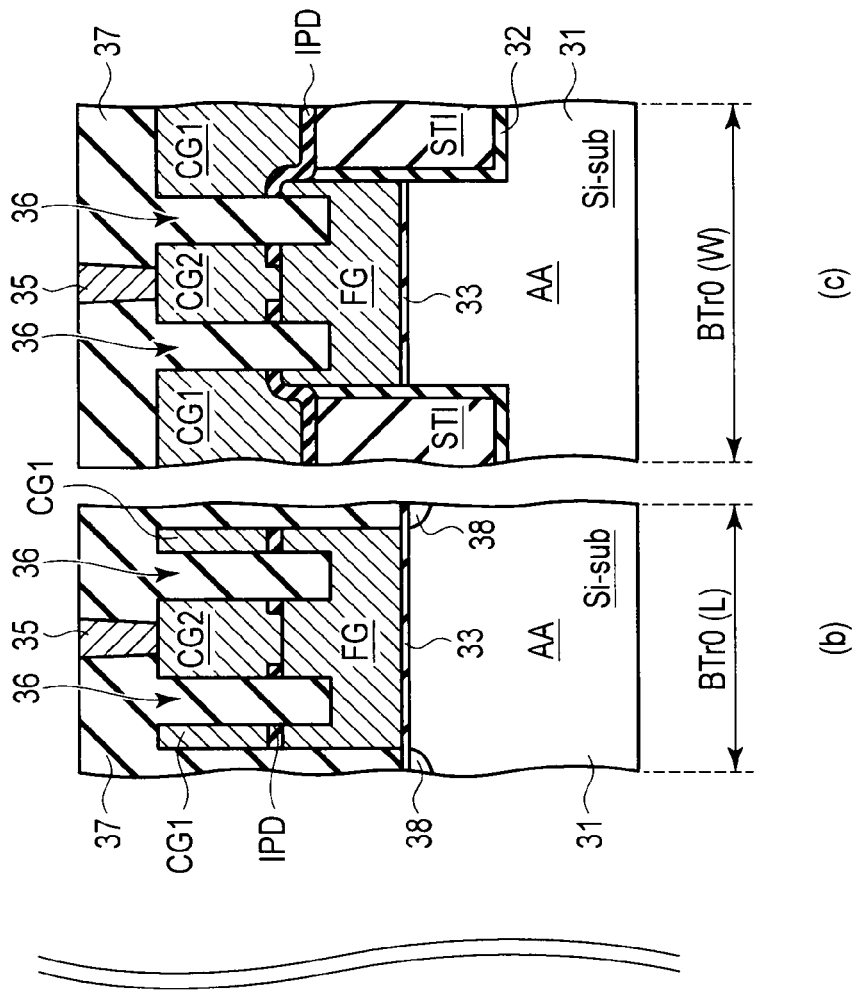
FIG. 14 is a cross-sectional view illustrating a fabrication step of the semiconductor device according to the first embodiment.
Figure 14:
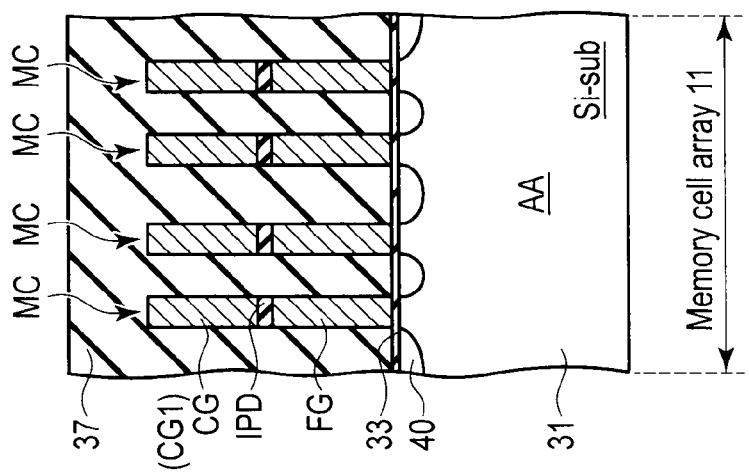

Then, as shown in parts (a) to (c) of FIG. 14, using the memory cells MC and the gate of the transfer transistor BTr0 as a mask, impurities are doped by, e.g. ion implantation, and source/drain diffusion layers 38 and 40 are formed in the semiconductor substrate 31.

Thereafter, a silicon oxide ($SiO_2$) film or the like is deposited by, e.g. CVD so as to cover the memory cells MC and transfer transistor BTr0, thereby forming a buried interlayer insulation film 37 in the trench 36.

Following the above, a contact wiring 35 is formed on the control gate CG2, and a contact wiring CS is formed on the source/drain diffusion layer 38. Thus, the above-described structure is fabricated.

4. Advantageous Effects

With the semiconductor device and the manufacturing method thereof according to the first embodiment, at least the following advantageous effects (1) and (2) can be obtained.

(1) The occurrence of leak current can be prevented and microfabrication can advantageously be achieved.

As has been described above, in the present embodiment, the transfer transistor includes the island-shaped second control gate (third conductive layer) CG2 which is detached and electrically isolated from the first control gate CG1 by the trench 36 which is formed around the second control gate CG2. The second control gate CG2 is connected to the floating gate FG (first conductive layer), which is provided under the second control gate CG2, via the opening EI in the inter-gate insulation film.

By controlling the gate potential which is applied to the control gate CG2, the potential of the control gate CG1 (on the outside of the trench 36) can be fixed. Therefore, leak current can advantageously be prevented.

For example, when the block is selected, as illustrated in FIG. 7, independent voltages can be applied to the control gates CG1 and CG2. Thus, it is possible to reduce the leak current Ileak1 due to field inversion which occurs beyond the device isolation film STI in the channel width direction. In addition, the control gate CG1 includes the offset region Doffset which extends toward the device region AA from the barrier film 32 in the cross section in the channel width direction. Thus, the effect of the shield voltage (0 V), which is applied to the control gate CG1, can greatly be exerted also to the end portions 39 of the device isolation film STI, which are indicated by broken lines in FIG. 7. As a result, when the block is selected, the leak current Ileak1 due to the field inversion can be reduced.

Furthermore, when the block is not selected, as illustrated in FIG. 8, FIG. 9 and FIG. 10, it is possible to suppress the leak current Ileak2 which occurs due to a parasitic transistor at end portions of the device isolation films STI in the channel length direction.

Besides, in the first embodiment, in order to prevent the leak current, there is no need to independently dispose a shield wiring or the like. Therefore, the interval between transfer transistors (BTr) in the channel width direction and channel length direction can be made narrower, and microfabrication can advantageously be achieved.

(2) The manufacturing cost can advantageously be reduced.

As shown in FIG. 12, in the first embodiment, when the control gate CG2 is formed, it should suffice if the mask pattern of the photoresist 41 is formed so as to form the opening at the position corresponding to the trench 36 which surrounds the periphery of the control gate CG2.

Therefore, for example, in order to reduce leak current, there is no need to additionally form a shield gate or the like between the transfer transistors, and the manufacturing cost can advantageously be reduced.

Second Embodiment

An Example of Disposition on Sense Amplifier Side

Next, referring to FIG. 15, a second embodiment is described. This embodiment relates to an example of disposition on a bit line lead-out part on a sense amplifier side. A detailed description of parts common to those of the first embodiment is omitted.

Structure Example

FIG. 15 shows a plan-view structure of transfer transistors Tr0 to Tr3 according to the second embodiment.

FIG. 15 shows the case in which the transfer transistors Tr0 to Tr3 are applied to a bit line lead-out part on the sense amplifier side, for example, a part for connecting bit lines BL0 to BL31 between the sense amplifier S/A and memory cell array 11 in FIG. 2. In the bit line lead-out part on the sense amplifier side, too, a relatively high voltage is applied, and the density of contact wirings for leading out bit lines is high. Thus, this structure is effective.

As shown in FIG. 15, the second embodiment differs from the first embodiment in that source/drain diffusion layers 38 are independently provided and are not shared between the transfer transistors Tr0 and Tr2, or transfer transistors Tr1 and Tr3, which neighbor in the channel length direction.

A contact wiring CS1 in the transfer transistor Tr0 in FIG. 15 is electrically connected to the memory cell array 11 side (bit line side), and a contact wiring CS2 is electrically connected to the sense amplifier side (S/A side).

Since the cross-sectional structure is common to the first embodiment, a detailed description thereof is omitted.

In addition, since the transfer operation and the manufacturing method are substantially common to the first embodiment, a detailed description is omitted.

Advantageous Effects

With the semiconductor device and the manufacturing method thereof according to the second embodiment, at least the same advantageous effects (1) and (2) as described above can be obtained. Furthermore, as illustrated in the second embodiment, the transfer transistor can be applied not only to the row decoder 12, but also to the bit line lead-out part on the sense amplifier side, where necessary.

Third Embodiment

An Example Including Shield Wiring

Next, referring to FIG. 16, a third embodiment is described. This embodiment relates to an example which further includes a shield wiring. A detailed description of parts common to those of the second embodiment is omitted.

Structure Example

FIG. 16 shows a plan-view structure of transfer transistors Tr0 to Tr3 according to the third embodiment.

As shown in FIG. 16, the third embodiment differs from the second embodiment in that a shield wiring 55 extending in the channel width direction is further provided between the transfer transistors Tr0 and Tr2 and between the transfer transistors Tr1 and Tr3, which neighbor in the channel length direction.

Since the cross-sectional structure is common to the first embodiment, a detailed description thereof is omitted.

At the time of the transfer operation, a predetermined shield voltage (e.g. ground power supply voltage of 0 V) is applied to the shield wiring 55. Thereby, field inversion can be prevented, and a leak current occurring due to the field inversion can advantageously be further reduced.

As regards the manufacturing method, after the transfer transistors Tr0 to Tr3 are fabricated, polysilicon or the like is formed by CVD along the channel width direction, thereby forming the shield wiring 55. In the other respects, the manufacturing method is substantially common to the first embodiment, so a detailed description is omitted.

Advantageous Effects

With the semiconductor device and the manufacturing method thereof according to the third embodiment, at least the same advantageous effects (1) and (2) as described above can be obtained.

Furthermore, in the third embodiment, the shield wiring 55 is further provided. By applying a predetermined shield voltage (e.g. ground power supply voltage of 0 V) to the shield wiring 55, field inversion can be prevented and a leak current occurring due to the field inversion can advantageously be further reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate including a device region which is partitioned by a device isolation film;
   a first conductive layer provided above the device region via a gate insulation film;
   an inter-gate insulation film provided on the first conductive layer and including an opening on the first conductive layer;
   a second conductive layer disposed over the device region and the device isolation film via the inter-gate insulation film;
   a third conductive layer provided on the first conductive layer, isolated from the second conductive layer by a peripheral trench, and connected to the first conductive layer via the opening of the inter-gate insulation film; and
   source/drain diffusion layers provided, spaced apart, in the device region in a manner to sandwich the first conductive layer.

2. The device of claim 1, wherein the second conductive layer extends on the device region in a cross section in a channel width direction extending through the opening.

3. The device of claim 1, wherein a cross-sectional area of the third conductive layer is smaller than a cross-sectional area of the first conductive layer in a cross section in a channel width direction extending through the opening.

4. The device of claim 1, further comprising a memory cell array including a plurality of memory cells arranged at intersections between a plurality of bit lines and a plurality of word lines,
   wherein the semiconductor device is disposed on a row decoder of the memory cell array or on a bit line lead-out part on a sense amplifier side of the memory cell array.

5. The device of claim 1, wherein the source/drain diffusion layer is shared between the semiconductor devices neighboring in a channel length direction.

6. The device of claim 1, wherein the source/drain diffusion layer is independently provided in each of the semiconductor devices and is not shared.

7. A semiconductor device comprising:
   a semiconductor substrate including a device region which is partitioned by a device isolation film;
   a first conductive layer provided above the device region via a gate insulation film;
   an inter-gate insulation film provided on the first conductive layer and including an opening on the first conductive layer;
   a second conductive layer disposed over the device region and the device isolation film via the inter-gate insulation film;
   a third conductive layer provided on the first conductive layer, isolated from the second conductive layer by a peripheral trench, and connected to the first conductive layer via the opening of the inter-gate insulation film;
   source/drain diffusion layers provided, spaced apart, in the device region in a manner to sandwich the first conductive layer; and
   a shield wiring disposed in a channel width direction on the semiconductor substrate between the semiconductor devices neighboring in a channel length direction.

8. The device of claim 7, wherein the second conductive layer extends on the device region in a cross section in the channel width direction extending through the opening.

9. The device of claim 7, wherein a cross-sectional area of the third conductive layer is smaller than a cross-sectional area of the first conductive layer in a cross section in the channel width direction extending through the opening.

10. The device of claim 7, further comprising a memory cell array including a plurality of memory cells arranged at intersections between a plurality of bit lines and a plurality of word lines,
    wherein the semiconductor device is disposed on a row decoder of the memory cell array or on a bit line lead-out part on a sense amplifier side of the memory cell array.

11. The device of claim 7, wherein the source/drain diffusion layer is independently provided in each of the semiconductor devices and is not shared.

12. A method for manufacturing of a semiconductor device, comprising:
    forming a gate insulation film on a semiconductor substrate;
    forming a first conductive layer on the gate insulation film;
    forming a device isolation film surrounding a device region in the semiconductor substrate;
    forming an inter-gate insulation film on the first conductive layer;
    removing a part of the inter-gate insulation film on the device region, and forming an opening which exposes the first conductive layer;
    forming a second conductive layer over the device region and the device isolation film via the inter-gate insulation film;
    forming a trench by removing the second conductive layer on the device region at least to a level on the inter-gate insulation film, thereby forming a third conductive layer which is isolated from the second conductive layer and connected to the first conductive layer via the opening;
    doping impurities in the device region and forming a source/drain diffusion layer, by using the first, second and third conductive layers as a mask; and
    forming an interlayer insulation film which covers the first, second and third conductive layers and is buried in the trench.

13. The method of claim 12, wherein the trench is formed on an inner side of the device region in a cross section in a channel width direction extending through the opening.

14. The method of claim 12, wherein a cross-sectional area of the third conductive layer is formed to be smaller than a cross-sectional area of the first conductive layer in a cross section in a channel width direction extending through the opening.

15. The method of claim 12, wherein the source/drain diffusion layer is formed commonly between the semiconductor devices neighboring in a channel length direction.

16. The method of claim 12, wherein the source/drain diffusion layer is independently provided in each of the semiconductor devices.

17. The method of claim 16, further comprising forming a shield wiring in a channel width direction on the semiconductor substrate between the semiconductor devices neighboring in a channel length direction.

* * * * *